United States Patent [19]

Fukui

[11] Patent Number: 5,250,907
[45] Date of Patent: Oct. 5, 1993

[54] DIGITAL SIGNAL MEASUREMENT APPARATUS

[75] Inventor: Takao Fukui, Kanagawa, Japan

[73] Assignee: Sony Corporation, Japan

[21] Appl. No.: 868,861

[22] Filed: Apr. 16, 1992

[30] Foreign Application Priority Data

Apr. 27, 1991 [JP] Japan ................... 3-125464

[51] Int. Cl.⁵ .................. H04B 1/12; G01R 23/20
[52] U.S. Cl. ....................... 324/614; 324/606;
324/626; 324/620; 324/128; 333/166; 333/176;
341/123; 341/120; 364/572
[58] Field of Search .......... 333/166, 176; 364/572,
364/724.18; 324/620, 128, 623, 614, 606

[56] References Cited

U.S. PATENT DOCUMENTS

| | | | |
|---|---|---|---|
| 3,711,769 | 1/1973 | Peake | 324/623 |
| 3,978,401 | 8/1976 | Lum | 324/620 |
| 4,052,559 | 10/1977 | Paul | 333/166 |
| 4,340,854 | 7/1982 | Jones | 324/623 |
| 4,417,310 | 11/1983 | Sugihara | 324/623 |
| 4,774,454 | 9/1988 | Yamaguchi | 324/623 |
| 5,113,139 | 5/1992 | Furukawa | 324/620 |

Primary Examiner—Kenneth A. Wieder
Assistant Examiner—Jose M. Solis
Attorney, Agent, or Firm—Ronald P. Kananen

[57] ABSTRACT

In this digital signal measurement apparatus, an approach is employed to deliver a measurement signal from a measurement signal generator to a measured circuit to transform the signal on the time base through the measured circuit to a signal on the frequency base by a frequency base transform circuit and to further obtain a signal on the time base by a time base transform circuit. Thus, a difference between the signal on the time base through the measured circuit and the signal on the time base from the time base transform circuit is employed. Thus, for example, even if the measured circuit is a linear system, a measured result in the digital region and a result of the analog measurement can be in correspondence with each other. Accordingly, gain correction of a measurement signal is unnecessary, thus making it possible to prevent an increase in an error of a measured result of S/N.

7 Claims, 4 Drawing Sheets

DIGITAL SIGNAL MEASUREMENT APPARATUS

BACKGROUND OF THE INVENTION

1. Field of the Invention

This invention relates to a digital signal measurement apparatus adapted for measuring a signal-to-noise ratio in a measured device such that a digital signal is inputted thereto and is outputted therefrom.

2. Description of the Prior Art

As a conventional configuration of a digital signal measurement apparatus adapted for measuring a signal-to-noise ratio (S/N) in a measured device adapted so that a digital signal is inputted thereto and is outputted therefrom, there is a measurement apparatus to which, e.g., a method of measuring a signal-to-noise ratio described in the Japanese Laid Open Patent Application No. 112313/90 is applied.

Namely, the measurement method described in the above publication comprises the steps of applying a sine wave signal to a measured circuit, sampling outputs from the circuit to store them into a memory, eliminating an offset component included in the content of the memory, carry out phase adjustment with the sine wave signal with a zero crossing point of the content being an initial point by using an interpolating function based on the sampling theorem, sampling phase-adjusted signal data, determining a sum of squares deviation between the sampled signal data and the sine wave signal subjected to gain corrective operation, and determining a signal-to-noise ratio by the result of the sum of squares deviation.

Accordingly, the configuration to which the measurement method described in this publication is applied is as shown in FIG. 1. The configuration of FIG. 1 will be briefly described below. In FIG. 1, a sine wave signal outputted from a sine wave generator 11 of a measurement instrument 3 is sent to a filter 2 of a measured circuit through terminals 12 and 21. An output of the filter 2 is sent to a memory 14 through terminals 22 and 13, and is stored thereinto. An output of the memory 14 is sent to an offset canceler 31, at which an offset component included in the output of the memory 14 is eliminated. An output of the offset canceler 31 is sent to an operational element 32, at which a zero crossing point is calculated. Further, at the operational element 33, a phase adjustment with the sine wave signal is carried out by using the zero crossing point as an initial point. Thus, phase-adjusted data is sent to an adder 36.

On the other hand, the sine wave signal from the sine wave generator 11 is also sent to a variable gain amplifier 34. At the variable gain amplifier 34, a correction corresponding to the gain of the filter 2 is applied to the sine wave signal. The gain-corrected signal thus obtained is sent to the adder 36 through the operational element 35. At the adder 36, a sum of squares deviation between the gain-corrected sine wave signal and the phase-adjusted data is determined. On the basis of an output of the adder 36, a S/N is determined at an operational element 37.

Here, the measurement method described in the above publication has problems as mentioned below.

Namely, first, since calculation of noise is made merely by comparison between digital data, e.g., in the case where a measured circuit (measured system) is a linear system, S/N does not correspond with that in the case of an analog measurement. In other words, in the case where a measured circuit (measured system) is a linear system, a measured result in the digital region and a measured result of the analog measurement corresponding to a bit length in the measured circuit do not correspond with each other and compatibility is lost.

In addition, in the configuration to which the method described in the above publication is applied, gain correction (e.g., gain correction at the variable gain element 34) is applied to a sine wave signal of a measurement signal by taking a gain of the measured circuit into consideration. For this reason, there is the possibility that an error of this gain correction may affect the measurement of the S/N.

OBJECTS AND SUMMARY OF THE INVENTION

With actual circumstances as described above in view, this invention has been proposed, and its object is to provide a digital signal measurement apparatus which can carry out measurement (having compatibility) in which a measured result in the digital region and a result of the analog measurement corresponding to a bit length in its measured circuit are in correspondence with each other, and which does not require gain correction of a measurement signal even if the measured circuit has a gain, thus making it possible to prevent an increase in an error of a measured result of S/N.

A digital signal measurement apparatus of this invention has been proposed in order to attain the above-described object, and is directed to a digital signal measurement apparatus adapted for measuring a signal-to-noise ratio of a measured circuit such that a digital signal is inputted thereto and is outputted therefrom, the apparatus comprising: measurement signal generator means for generating a measurement signal on the time base delivered to the measured circuit, frequency base transform means for transforming the measurement signal on the time base through the measured circuit to a signal on the frequency base, and time base transform means for transforming the signal on the frequency base to a signal on the time base, thus to measure a signal-to-noise ratio of the measured circuit by using, as a noise component in the signal-to-noise ratio, a difference between the measurement signal on the time base through the measured circuit and the signal on the time base outputted from the time base transform means.

Here, as a measurement signal generated by the measurement signal generator means, e.g., a sine wave signal can be enumerated. Further, as the frequency base transform processing in the frequency base transform means, e.g., so called a Discrete Fourier Transform (DFT) processing can be enumerated. It is desirable that the total number of samples of the frequency base transform processing is set to, e.g., prime number. In addition, it is preferable that, in the time base transform means, a signal spectrum of the same frequency ($f=f_0$) as a frequency $f_0$ of a measurement signal from the measurement signal generator means of an output of the frequency base transform means is used to carry out time base transform processing.

In accordance with the digital signal measurement apparatus of this invention, since an approach is employed to transform a measurement signal on the time base through a measured circuit to a signal on the frequency base to further transform the frequency component thus obtained to a signal on the time base, it is possible to carry out measurement which is not affected by gain, etc. of the measured circuit. Further, since time base transformed data is assumed as ideal data and a difference between that data and data from the measured circuit is used as a noise component, a measurement in which a measured can be carried out result in the digital region and a result of the analog measurement corresponding to a bit length in the measured circuit are in correspondence with each other.

Namely, in the digital signal measurement apparatus of this invention, an approach is employed to deliver a measurement signal from the measurement signal generator means to the measured circuit to transform the measurement signal through the measured circuit to a signal on the frequency base by the frequency base transform means to further transform an output signal of the frequency base transform means to a signal on the time base for a second time by the time base transform means to determine a difference between the measurement signal on the time base through the measured circuit and an output signal of the time base transform means and to employ a difference output as a noise component used for measurement of a signal-to-noise ratio (S/N) of the measured circuit. A measurement can be conducted (S/N measurement having compatibility) in which a measured result in the digital region and a result of the analog measurement correspond to a bit length of measurement data in the measured circuit. In addition, even if the measured circuit has a gain, gain correction of a measurement signal is unnecessary, thus making it possible to prevent an increase in an error of a measured result of S/N.

DESCRIPTION OF THE PREFERRED EMBODIMENTS

Preferred embodiments of a digital signal measurement apparatus according to this invention will now be described with reference to the attached drawings.

Figure 2:
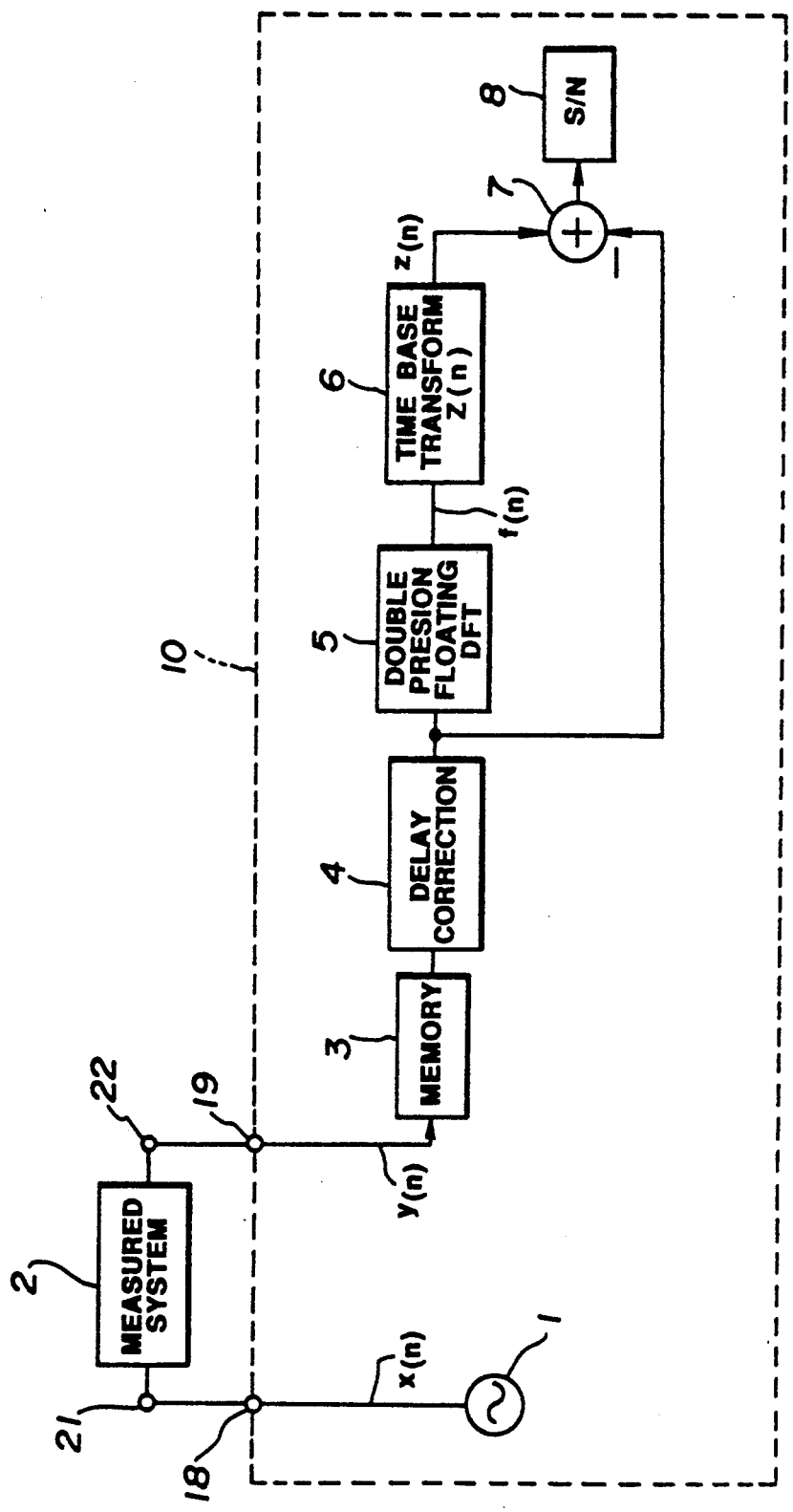
FIG. 2 is a circuit diagram showing, in a block form, an embodiment of a digital signal measurement apparatus according to this invention.

FIG. 2 is a circuit diagram showing, in a block form, the outline of the configuration of an embodiment of a digital signal measurement apparatus 10 adapted for measuring a signal-to-noise ratio (S/N) in a digital region of a measured circuit (measured system) 2 supplied with a digital signal through a terminal 21 to output a digital signal through a terminal 22.

The digital signal measurement apparatus 10 of FIG. 2 comprises a generator 1 as measurement signal generator means for generating a measurement signal (sine wave signal x(n)) on the time base delivered to the measured circuit 2, a frequency base transform circuit 5 for implementing, e.g., Discrete Fourier Transform (DFT) processing to a measurement signal on the time base through the measured circuit 2 (measured circuit output data y(n)) to transform it to a signal on the frequency base (spectrum value $S_0$), a time base transform circuit 6 for transforming the signal on the frequency base from the frequency base transform circuit 5 to a signal on the time base (time base transformed data z(n)) for a second time, and a subtracter 7 for calculating a difference between the measured circuit output data y(n) through the measured circuit 2 and the time base transformed data z(n) from the time base transform circuit 6. Thus, the apparatus 10 can measure a signal-to-noise (S/N) ratio of the measured circuit 2 by using an output of the subtracter 7 as a noise component (noise component $\delta$).

Here, in this embodiment, a delay value of the measured circuit 2 is first measured. For example, an approach is employed for this purpose to output an impulse from the generator 1 to measure an output from the measured circuit 2 at the same time that impulse is inputted thereto to store that response into a memory 3 to provide a delay value. In this embodiment, this delay value is caused to be M samples (M is an integer).

Figure 3:
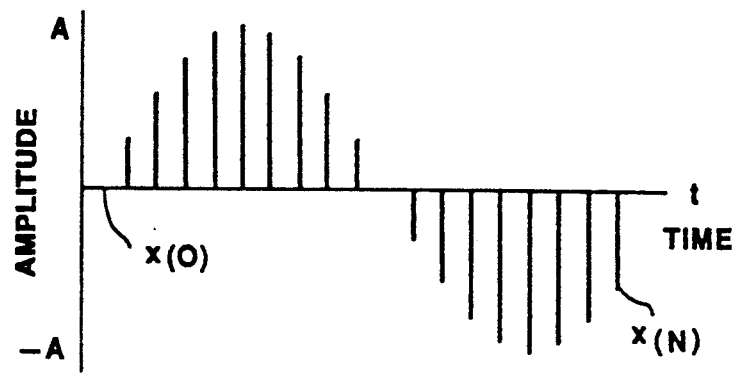
FIG. 3 is a diagram showing data of a sine wave signal.

Then, the generator 1 generates, e.g., a sine wave signal x(n) as the measurement signal to output it therefrom. The value of this sine wave signal x(n) is ideally rounded in correspondence with the number of bits (e.g., 16 bits, 24 bits, 32 bits, etc.) in the measured circuit 2 so that the total number of samples can be divided out by the period. Namely, the sine wave signal x(n) in this embodiment is such that, e.g., the total number of samples as shown in FIG. 3 is set to N+1 (N is an integer), and that the period is set to a value corresponding to (N+1) samples. The sine wave signal x(n) outputted from the generator 1 can be expressed by the following equation (1).

$$x(n) = (A \cdot \sin(2\pi f_0 n)) \qquad (1).$$

In the above equation (1), the value of the sine wave signal x(n) is rounded off in correspondence with the number of bits at the measured circuit as described above, A represents an amplitude ($0 < A \leq 1.0$: A is equal to 1.0 if the measured circuit 2 has no gain), $f_0$ is a frequency of a measurement signal (sine wave signal x(n)), and n is an integer expressed as $0 \leq n \leq N$.

The sine wave signal x(n) is delivered to the measured circuit 2 through terminals 18 and 21 to send measured circuit output data (response data) outputted from the measured circuit 2 to the memory 3 through terminals 22 and 19 to store it into the memory 3.

Figure 4:
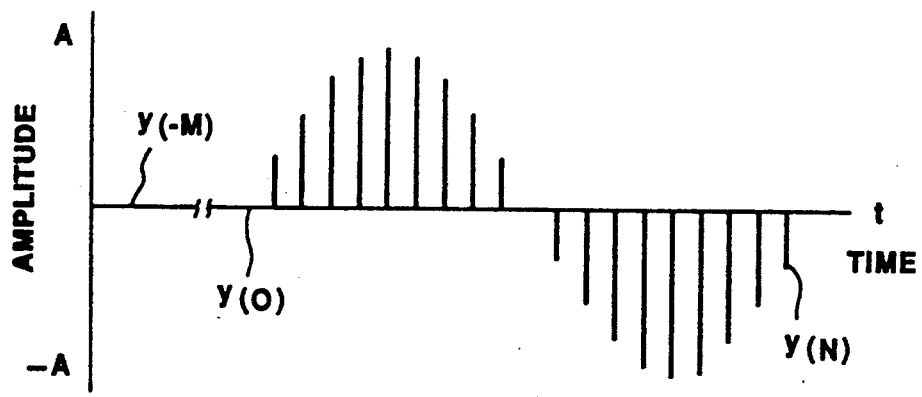
FIG. 4 is a diagram showing data of a sine wave signal including a delay value.

Here, in the measured circuit output data y(n) shown in FIG. 4 stored in the memory 3, a delay corresponding to the above-described M samples is included. For this reason, this data y(n) is expressed as y(−M), ..., y(−1), y(0), ..., y(N). In this embodiment, data y(0), ..., y(N) obtained by eliminating, by using a delay value correction circuit 4, data y(−M), ... y(−1) corresponding to M samples of the delay value from the data y(−M), ..., y(−1), y(0), ..., y(N) of the measured circuit output data y(n) is used for measurement.

Figure 5:
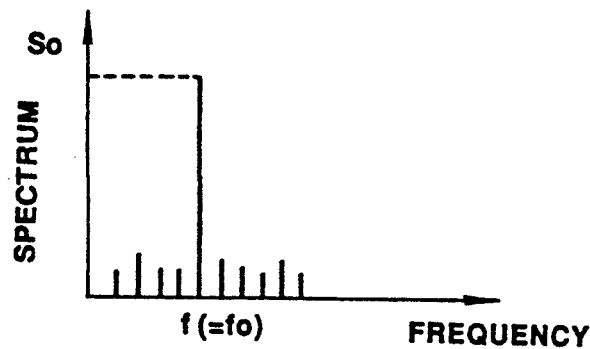
FIG. 5 is a diagram showing a spectrum obtained as the result of the fact that data is transformed to data on the frequency base.

These (N+1) data y(n) used for measurement are sent to the frequency base transform circuit 5 for carrying out Discrete Fourier Transform (DFT) processing, e.g., with a double precision (floating operation) of the number of bits at the measured circuit 2. As the result of the fact that these data y(n) are subjected to DFT processing at the frequency base transform circuit 5, a spectrum value $S_0$ of frequency f and other frequency components as shown in FIG. 5 are provided. Here, a frequency $f_0$ of the sine wave signal x(n) generated at the generator 1 is known in advance, and the frequency f of the spectrum value $S_0$ obtained by the processing at the frequency base transform circuit 5 and the frequency $f_0$ are equal to each other ($f=f_0$). In this embodiment, the spectrum value $S_0$ of the frequency $f1=f_0$ is used as a signal spectrum with respect to response of the measured circuit 2.

Figure 6:
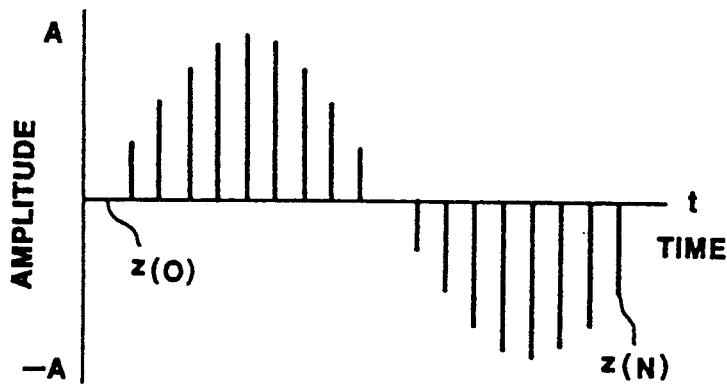
FIG. 6 is a diagram showing data subjected to time base transform processing.

Further, in addition to the signal frequency $f_0$ of the sine wave signal x(n), the total number of samples $N+1$ is also known in advance (i.e., N is known in advance). In this embodiment, the frequency $f_0$ and N, and the spectrum value $S_0$ from the frequency base transform circuit 5 are used to provide a signal on the time base (time base transformed signal z(n)) shown in FIG. 6 for a second time at the time base transform circuit 6. The time base transform processing at the time base transform circuit 6 is represented by the following equation (2). It is to be noted that in the case where DFT processing is carried out at the frequency base transform circuit 5, inverse-DFT processing is carried out at the time base transform circuit 6.

$$z(n) = S_0 \cdot \sin(2\pi f_0 n) \quad (2).$$

In the above equation (2), z(n) is data obtained by double precision (floating). It is to be noted that, in the time base transform processing (equation (2)) at the time base transform circuit 6, since phase adjustment is carried out by delay value correction at the delay value correction circuit 4, there is no cosine component.

In this embodiment, an approach is employed to take time base transformed data z(n) calculated by the equation (2) as an ideal value (reference) with respect to response of the measured circuit 2. In this embodiment, a difference between the time base transformed data z(n) and the measured circuit output data (delay corrected data) y(n) is calculated by the subtracter 7 to assume an output of the subtracter 7 (difference between data z(n) and y(n)) as a noise component of this system (measured circuit 2). This noise component is sent to a S/N calculation circuit 8.

When the noise component is now assumed as $\delta$, a sum of squares of noise components in the total number of samples $N+1$ is expressed by the following equation (3).

$$\delta^2 = |y(0) - z(0)|^2 + |y(1) - z(1)|^2 + \ldots + |y(N) - z(N)|^2 \quad (3)$$
$$= \sum_{n=0}^{N} |y(n) - z(n)|^2$$

Further, an energy E of a signal component in determining S/N is calculated from the spectrum value $S_0$, and is expressed by the following equation (4). The proof of this equation (4) is omitted here.

$$E = \frac{N}{2} S_0^2 \quad (4)$$

Accordingly, S/N can be determined by carrying out the calculation of the following equation (5). These calculations are carried out by the S/N calculation circuit 8.

$$S/N = -10 \log \frac{\delta^2}{(N/2)S_0^2} \text{ [dB]} \quad (5)$$

From facts as described above, the digital signal measurement apparatus 10 of this embodiment is operative to deliver a sine wave signal x(n) which is a measurement signal from the generator 1 to the measured circuit 2. At the frequency base transform circuit 5, Discrete Fourier Transform (DFT) processing to the data y(n) is passed through the measured circuit 2 and subjected to corrective processing of a delay value to obtain a spectrum value $S_0$ ($f=f_0$) to further obtain for a second time a signal (data z(n)) on the time base by using the spectrum value So at the time base transform circuit 6. For this reason, even if the measured circuit 2 has any gain, gain correction of a measurement signal is unnecessary, thus making it possible to prevent an increase in an error of a measured result of S/N. Further, an approach is also employed to obtain a difference between the data y(n) and output data z(n) of the time base transform circuit 6 at the subtracter 7 and to employ a difference output from the subtracter 7 as a noise component for measurement of the signal-to-noise ratio (S/N) of the measured circuit 2. For this reason, even if, e.g., the measured can be conducted circuit 2 is a linear system, a measurement in which a measured result in the digital region and a result of the analog measurement corresponding to a bit length of measurement data in the measured circuit 2 are in correspondence with each other.

Furthermore, in this invention, even if a delay value of the measured circuit 2 is in advance measured as in the above-described embodiment, the S/N can be determined.

Namely, in another embodiment of this invention, an approach is employed to repeatedly and successively carry out input/output of, e.g., a sine wave signal x(n) shown in FIG. 3 with respect to measured circuit 2 to store output data of the measured circuit 2 into the memory 3 after time has passed sufficiently beyond a delay time at the measured circuit 2. Arbitrary (N+1) successive data stored into the memory 3 are used as the data y(O), . . . , y(N) delivered to the frequency base transform circuit 5.

It is to be noted that if a delay value is known in advance as in the previously described embodiment, phase adjustment can be carried out. Since the delay value is unknown in the time base transform circuit 6 of the second embodiment, the data z(n) is preferably determined as indicated by the following equation (6) by using a coefficient $S_{OS}$ of the sine component and a coefficient $S_{OC}$ of the cosine component obtained by the Discrete Fourier Transform processing.

$$z(n) = S_{OS} \cdot \sin(2\pi f_0 n) + S_{OC} \cdot \cos(2\pi f_0 n) \quad (6).$$

Since the processing succeeding to the time base transform circuit 6 is the same as that in the above-described configuration of FIG. 2, its explanation is omitted here. Also in the second embodiment, effects or advantages similar to those with the configuration of FIG. 2 can be provided.

Figure 7:
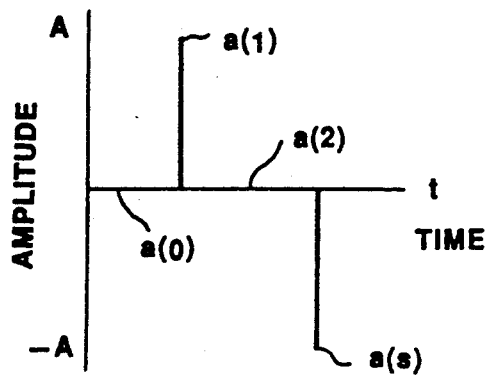
FIG. 7 is a diagram showing data in which N is equal to 3 (the total number of samples is 3+1) and the period is also equal to 3+1.

Meanwhile, since, in the above-described respective embodiments, extraction of a signal component (spectrum value $S_0$) is carried out by carrying out the Discrete Fourier Transform processing at the frequency base transform circuit 5, it is considered that, for example, if noise has any correlation with respect to a signal frequency $f_0$, separation between the spectrum $S_0$ and a noise spectrum is unable to be carried out. For example, if N is equal to 3 (total number of samples $N+1=3+1$) and the period is similarly expressed as $N+1=3+1$ as in the case of data a(0), a(1), a(2), a(3) shown in FIG. 7, the sine wave signal, i.e., input data x(n) to the measured circuit 2 is as indicated by the following equations (7) to (10).

$$x(0)=(1.0 \sin (2\pi f_0 0))=0 \tag{7}$$

$$x(1)=(1.0 \sin (2\pi f_0/4f_0))=1 \tag{8}$$

$$x(2)=(1.0 \sin (2\pi f_0 2/4f_0))=0 \tag{9}$$

$$x(3)=(1.0 \sin (2\pi f_0 4/4f_0))=-1 \tag{10}$$

Figure 1:
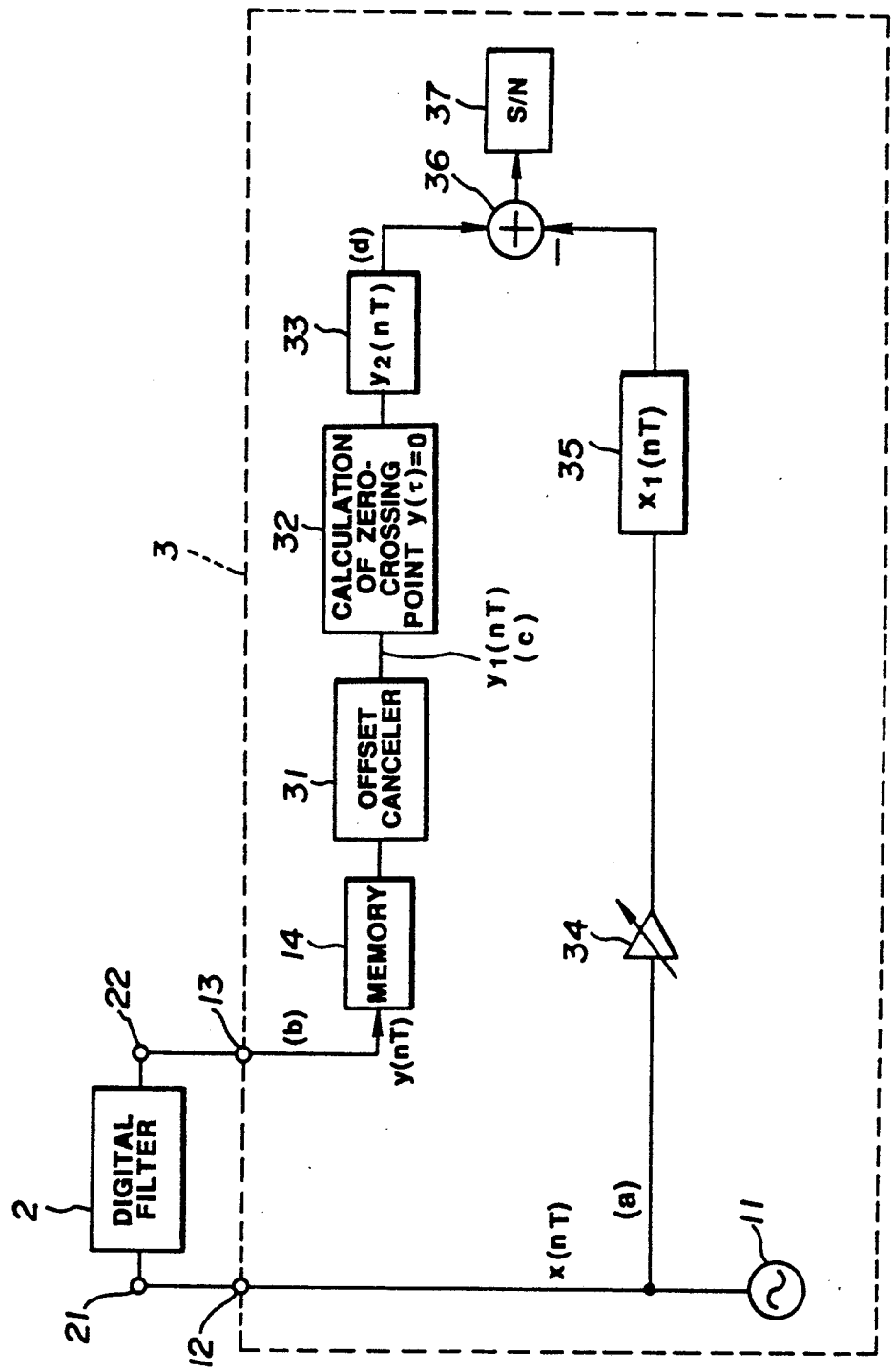
FIG. 1 is a circuit diagram showing, in a block form, the outline of the configuration of a digital signal measurement apparatus of the prior art.

At this time, for example, if the measured circuit 2 is entirely linear, the time base transformed data z(n) and measured circuit output data y(n) would be in correspondence with each other. Namely, output data z(n) of the time base transform circuit 6 takes values as follows: $z(0)=0.000\ldots$, $z(1)=1.000\ldots$, $z(2)=0.000\ldots$, $z(3)=-1.000\ldots$; and the noise component $\delta$ is also equal to zero. For this reason, measurement of S/N is unable to be carried out, thus causing the result similar to that with the above-described configuration shown in FIG. 1.

Accordingly, it is necessary that a quantization error occurring by rounding has no correlation with respect to a signal frequency. For such reasons, in the embodiments of this invention, for example, the total number of samples $N+1$ is caused to be a prime number. When the total number of samples $N+1$ is caused to be a prime number as stated above, even if the measured circuit 2 is linear, a quantization error corresponding to the number of bits at the measured circuit 2 will be included in the data z(n). Accordingly, there is no possibility that the data z(n) and the data y(n) are in correspondence with each other. Namely, there is no possibility that measurement of S/N is unable to be carried out in the apparatuses of the embodiments of this invention.

What is claimed is:

1. A digital signal measurement apparatus for measuring a signal-to-noise ratio of a measured circuit such that a digital signal is inputted thereto and is outputted therefrom, said apparatus comprising:

measurement signal generator means for generating a measurement signal on the time domain which is delivered to said measured circuit;

frequency domain transform means for transforming the measurement signal on the time domain through the measured circuit to a signal on the frequency domain; and time domain transform means for transforming the signal on the frequency domain from said frequency domain transform means to a second signal on the time domain;

wherein a signal-to-noise ratio of the measured circuit is measured by using, as a noise component in the signal-to-noise ratio, a difference between the measurement signal on the time domain through the measured circuit and the second signal on the time domain outputted from the time domain transform means.

2. A digital signal measurement apparatus as set forth in claim 1, wherein said time domain transform means carries out time domain transform processing by using a signal spectrum having a frequency equal to a frequency of the measurement signal from said measurement signal generator means and which is a frequency of an output of said frequency domain transform means.

3. A digital signal measurement apparatus as set forth in claim 1, wherein a sine wave signal is used as said measurement signal generated by said measurement signal generator means.

4. A digital signal measurement apparatus as set forth in claim 1, wherein Discrete Fourier Transform processing is used in said frequency domain transform means.

5. A digital signal measurement apparatus as set forth in claim 4, wherein the total number of samples of the frequency domain transform processing in said frequency domain transform means is a prime number.

6. A digital signal measurement apparatus as set forth in claim 1, wherein said time domain transform means comprises an inverse Discrete Fourier Transform processor.

7. A digital signal measurement apparatus as set forth in claim 1, further comprising a delay value correction circuit for eliminating a phase difference between said measurement signal and said second signal on the time domain.

* * * * *